(12) United States Patent
Aoki

(10) Patent No.: US 7,956,335 B2
(45) Date of Patent: Jun. 7, 2011

(54) WAFER HOLDING TOOL FOR ION IMPLANTING APPARATUS

(75) Inventor: Yoshiro Aoki, Tokyo (JP)

(73) Assignee: Sumco Corporation, Minato-ku, Tokyo (JP)

( * ) Notice: Subject to any disclaimer, the term of this patent is extended or adjusted under 35 U.S.C. 154(b) by 189 days.

(21) Appl. No.: 12/501,311

(22) Filed: Jul. 10, 2009

(65) Prior Publication Data

US 2010/0012856 A1  Jan. 21, 2010

(30) Foreign Application Priority Data

Jul. 11, 2008  (JP) ................ 2008-181106

(51) Int. Cl.
*G01J 1/00* (2006.01)
(52) U.S. Cl. .......... 250/491.1; 250/492.21; 279/85
(58) Field of Classification Search ............ 156/345.14; 118/318, 300; 134/142, 149, 159; 279/4.09, 279/85; 250/292.21, 292.2, 507.1, 576
See application file for complete search history.

(56) References Cited

U.S. PATENT DOCUMENTS

| 5,930,643 | A |  | 7/1999 | Sadana |  |
| 6,146,463 | A | * | 11/2000 | Yudovsky et al. | 118/729 |
| 2002/0185163 | A1 | * | 12/2002 | Peace et al. | 134/137 |
| 2003/0024557 | A1 | * | 2/2003 | Olgado et al. | 134/902 |
| 2007/0199656 | A1 | * | 8/2007 | Leavitt et al. | 156/345.11 |

* cited by examiner

*Primary Examiner* — David P Porta
*Assistant Examiner* — Jason McCormack
(74) *Attorney, Agent, or Firm* — Christensen O'Connor Johnson Kindness PLLC

(57) ABSTRACT

A wafer holding assembly is provided that is capable of preventing the temperature difference generated between a wafer and a holding pin through beam irradiation.

In one embodiment, the wafer holding assembly has a plurality of holding pins for holding a wafer in the ion implanting apparatus, the holding pin comprises a head contacting with an end face of the wafer to control motion of the wafer and a flange projecting from the head to place the wafer, and the head is provided with a canopy portion extending in a direction different from a side placing the wafer.

5 Claims, 4 Drawing Sheets

WAFER HOLDING TOOL FOR ION IMPLANTING APPARATUS

BACKGROUND OF THE INVENTION

1. Field of the Invention

This invention relates to a wafer holding assembly for holding a wafer in an ion implantation apparatus used when ions are implanted into a wafer such as a silicon wafer, and more particularly to a wafer holding assembly capable of controlling a temperature distribution in a plane of the wafer.

2. Description of the Related Art

At this moment, a typical production method of an SIMOX wafer is called an MLD (Modified Low Dose) method, wherein an oxygen ion implantation is conducted in two stages (see Patent Document 1). That is, the first oxygen ion implantation is carried out by heating a silicon wafer to a higher temperature, and then the second oxygen ion implantation is carried out by lowering the temperature of the silicon wafer to about room temperature. In the first oxygen ion implantation, the silicon wafer is heated to form a layer having a high oxygen concentration on the surface of the silicon wafer while maintaining at a state of a single crystal, and in the subsequent second oxygen ion implantation is formed an amorphous layer. Thereafter, the high-temperature heat treatment is conducted in a mixed gas of oxygen and argon to form an SOI structure.

[Patent Document 1] U.S. Pat. No. 5,930,643

In an oxygen ion implantation apparatus used for producing the above SIMOX wafer, a holding assembly 1 as shown in FIG. 1 is known as a wafer holding assembly (see Patent Document 2). The wafer holding assembly 1 has a mechanism as shown in FIG. 1 that wafer holding pins 2 are fixed to three end places of a holder 10 made of a substantially Y-shaped frame body and a wafer 3 is held at the three places of the holder through these holding pins 2.

[Patent Document 2] U.S. Pat. No. 6,794,662

As shown in FIGS. 2A-2C, the holding pin 2 comprises a head 4 contacting with an end face of the wafer 3 to control the motion of the wafer 3, and a flange 5 projecting from the head 4 to place the wafer 3. As shown in FIG. 2C, the wafer 3 is held at a state of being sandwiched between the head 4 and the flange 5.

In the conventional wafer holding assembly 1, the head 4 is made small and the flange 5 is formed to have a diameter larger than that of the head 4 in order to pervade irradiation beams all over the end portion of the wafer at the oxygen ion implantation step, for example, in the production of SIMOX wafer or to prevent so-called shadowing. For example, when the form of the holding pin 2 is a typical cylindrical form, the diameter of the flange 5 is commonly not less than 1.5 times the diameter of the head 4.

In the production method of the SIMOX wafer through the above MLD method, however, when the temperature of the wafer is particularly raised by the irradiation of beams in the second oxygen ion implantation, there is caused a temperature difference between the wafer and the holding pin because they are different in the shape and material. The influence of such a temperature difference appears as a thickness irregularity of an amorphous layer in the wafer located in the vicinity of the holding pin. In the wafer after the high-temperature heat treatment, therefore, one unresolved problem is thickness irregularity, particularly in SOI or BOX layers in the vicinity of the holding pin 2.

SUMMARY OF THE INVENTION

It is, therefore, an object of the invention to advantageously solve the above problems and to provide a wafer holding assembly capable of preventing the temperature difference particularly generated between a wafer and a holding pin through beam irradiation.

That is, the summary and construction of the invention are as follows.

(1) A wafer holding assembly in an ion implanting apparatus having a plurality of holding pins for holding a wafer in the ion implanting apparatus, characterized in that the holding pin comprises a head contacting with an end face of the wafer to control motion of the wafer and a flange projecting from the head to place the wafer, and the head is provided with a canopy portion extending in a direction different from a side placing the wafer.

(2) A wafer holding assembly in an ion implanting apparatus according to the item (1), wherein the canopy portion has a fan-like planar form.

(3) A wafer holding assembly in an ion implanting apparatus according to the item (2), wherein the fan-like form of the canopy portion has a spreading angle of not less than –50°.

(4) A wafer holding assembly in an ion implanting apparatus according to the item (2) or (3), wherein the spreading angle of the fan-like form of the canopy portion is not more than 180°.

According to the invention, the temperature rise of the holding pin is attained by disposing the canopy portion on the head of the wafer holding pin to receive heat quantity injected by beams, whereby the temperature difference generated between the holding pin and the wafer can be controlled to avoid a thickness irregularity in a portion of the wafer in the vicinity of the holding pin.

BRIEF DESCRIPTION OF THE DRAWINGS

The invention will be described with reference to the accompanying drawings, wherein.

DESCRIPTION OF THE PREFERRED EMBODIMENTS

Figure 1:
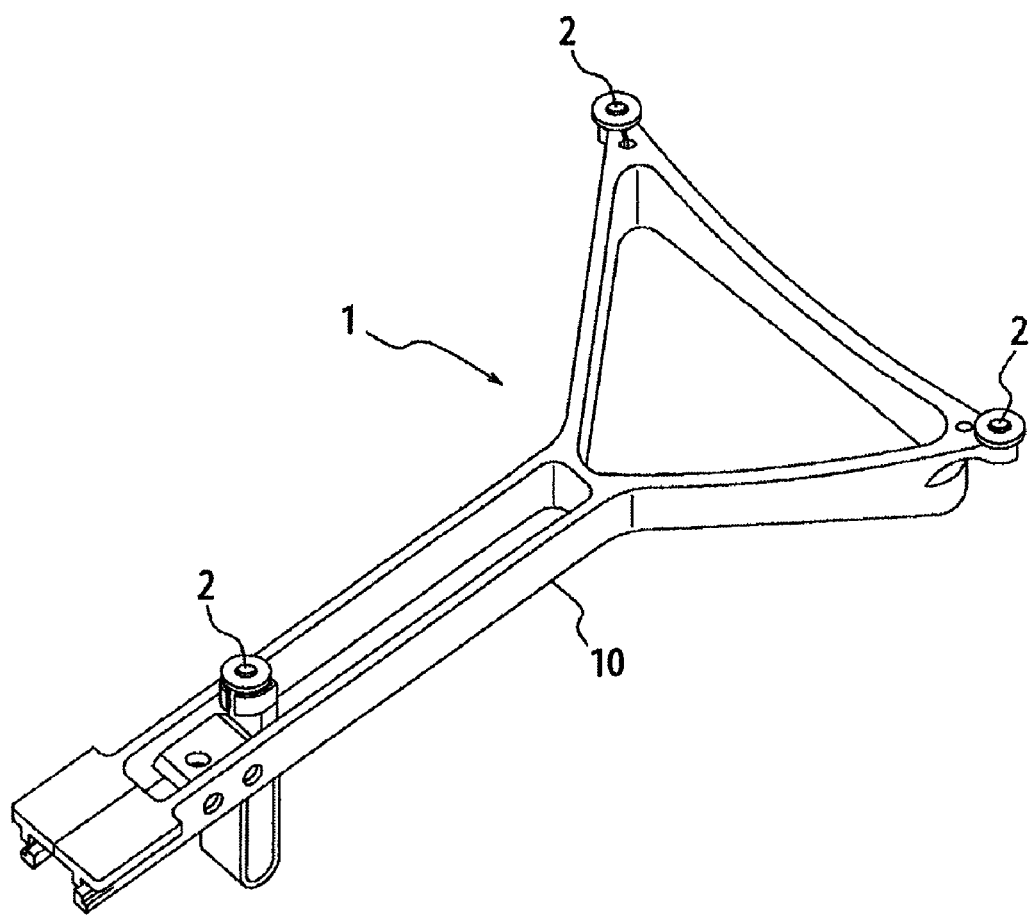
FIG. 1 is a perspective view of a wafer holding assembly.

A wafer holding assembly 1 according to the invention has a mechanism that wafer holding pins 2 are fixed to three end places of a holder 10 made of a substantially Y-shaped frame body and a wafer 3 is held at the three places of the holder through these holding pins 2 as shown in FIG. 1 likewise the former case.

Figure 3A:
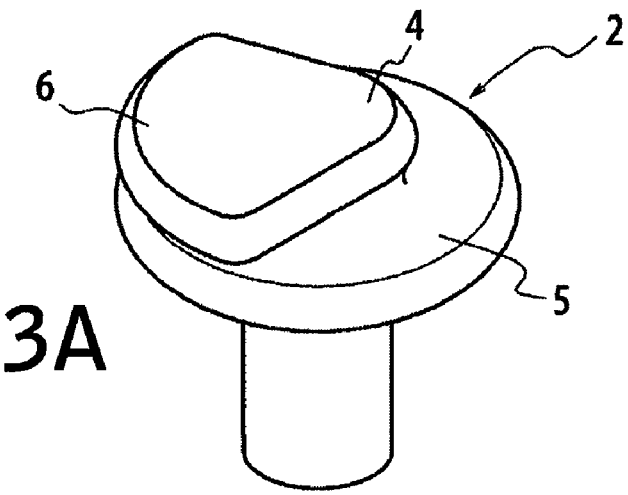
FIGS. 3A-3C are views illustrating a holding pin in a wafer holding assembly according to the invention.
Figure 3B:
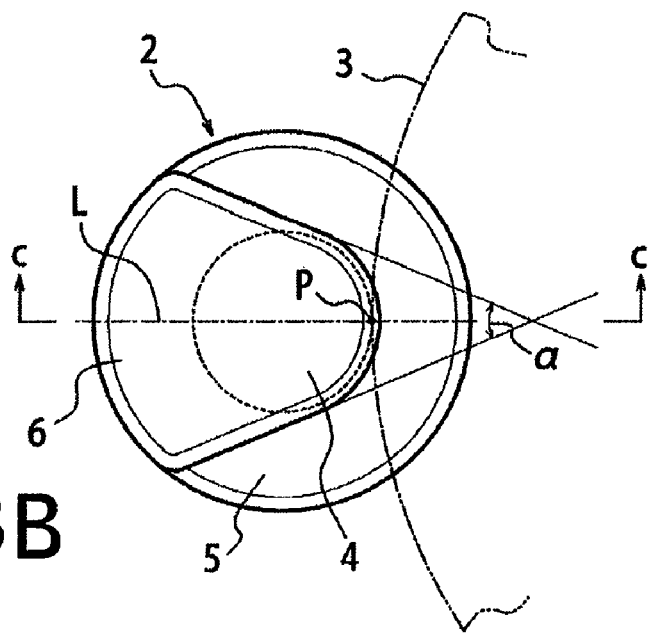
Figure 3C:
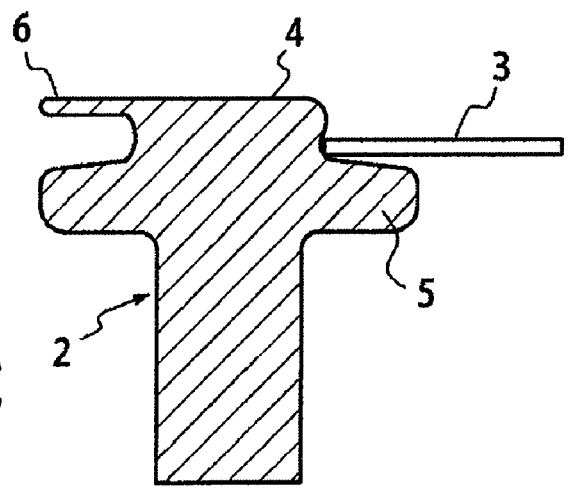

In the invention, it is important that in the holding pin 2 comprising a head 4 contacting with an end face of the wafer 3 to control motion of the wafer 3 and a flange 5 projecting from the head 4 to place the wafer 3 as shown in FIGS. 3A-3C, the head 4 is further provided with a canopy portion 6 extending in a direction different from a side placing the wafer 3, or in a direction opposing to the side placing the wafer 3 behind the head 4 radially at the outside of the head 4 in the illustrated embodiment.

As shown in FIGS. 3A and 3B, the canopy portion 6 has a fan-like form spreading and extending from the head 4 to ensure an area for receiving irradiation beams. Heat quantity injected by the beams is stored in the holding pin 2 through the canopy potion 6. Since the heat quantity obtained in the canopy portion 6 from the beams is proportional to the area of the canopy portion 6, the degree of the temperature rise in the canopy portion 6 and hence the holding pin 2 becomes larger in proportion to such an area, which becomes particularly an effective means for controlling the temperature difference between the holding pin 2 and the wafer 3 at the step of implanting ions into the wafer 3.

Figure 4:
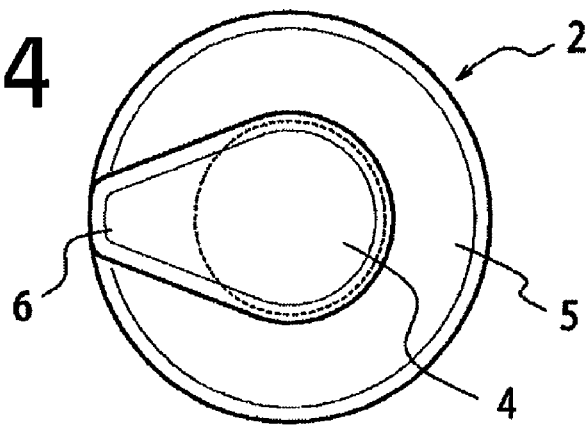
FIG. 4 is a view illustrating another embodiment of a holding pin.
Figure 5:
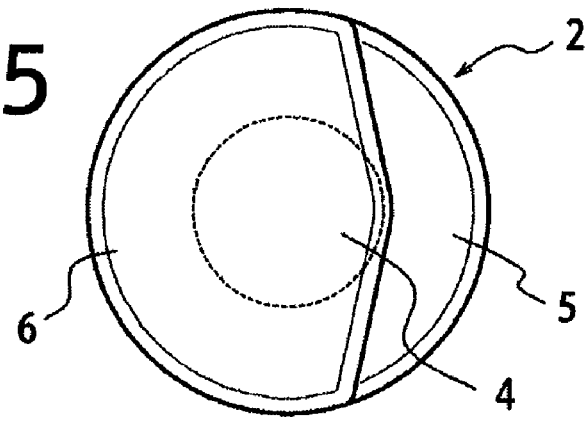
FIG. 5 is a view illustrating another embodiment of a holding pin.

Here, when the canopy portion 6 takes a fan-like form, its spreading angle is not limited to the case shown in FIGS. 3A-3C, and it is possible to take, for example, a fan-like form having a small spreading angle as shown in FIG. 4 or a fan-like form having a large spreading angle as shown in FIG. 5.

In this case, the spreading angle is preferable to be within a range of $-50°$ to $180°$. Moreover, the spreading angle is a central angle of the fan-like form and more concretely an angle $\alpha$ shown in FIG. 3B. The spreading angle $\alpha$ is preferable to be not less than $-50°$. When the angle $\alpha$ is less than $-50°$, it is difficult to ensure the sufficient area for receiving the irradiation beams.

Moreover, the spreading angle $\alpha$ of $0°$ means that two sides each being a radial portion of the fan-like form in the canopy portion are parallel and extend in a rectangular form with a width corresponding to the diameter of the head 4. Further, when the two sides have an arrangement of closing from the parallel state as shown in FIG. 4, a total of angles of two sides with respect to parallel side of $\alpha:0°$ is represented as minus (−). For example, the spreading angle of the canopy portion shown in FIG. 4 is $-40°$.

On the other hand, the upper limit of the spreading angle of the canopy portion 6 is preferable to be $180°$. That is, when the spreading angle exceeds $180°$, the canopy portion gets into a side of the wafer so as to shut out the irradiation beams and hence there is a fear that the beams do not reach the wafer end.

As a condition of the spreading angle for the canopy portion, as shown in FIG. 3B, when the wafer 3 is placed on the flanges 5 of the holding pins 2, if a portion of the head 4 contacting with the wafer 3 in each of the holding pins 2 is a control point P and a peripheral surface of the head is regarded as a circular arc, it is sufficient to form the canopy portion so that a' normal line L passing through the control point P results in the center of the above spreading angle $\alpha$.

Figure 6:
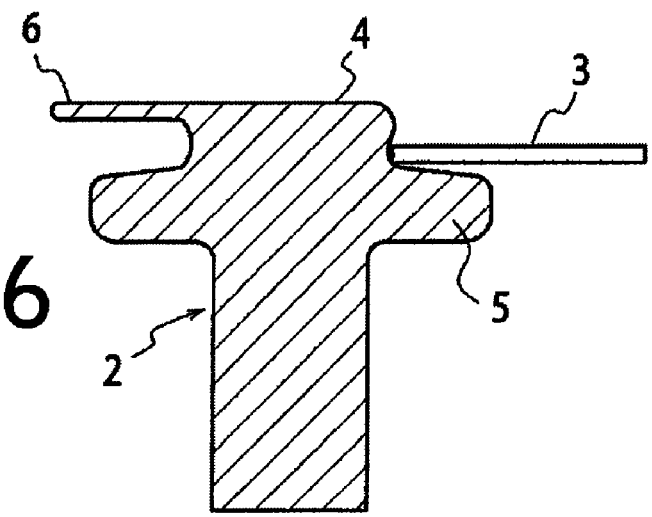
FIG. 6 is a view illustrating another embodiment of a holding pin.

In the illustrated embodiment, the canopy portion is equal to a projection amount of the flange 5. As shown in FIG. 6, the canopy portion 6 may be projected from the head 4 beyond the projection amount of the flange 5. In the latter case, a radius of the canopy portion 6 is preferable to be a projection amount not causing deformation without lowering the strength of the canopy portion 6.

Furthermore, the canopy portion 6 is a thin sheet capable of reducing a heat capacity, which is preferable to have a thickness not causing deformation without lowering the strength of the canopy portion 6.

EXAMPLE

Next, an example of the invention will be described in detail with a comparative example.

A holding assembly is prepared by disposing a holding pin of a specification shown in Table 1 in a holder shown in FIG. 1, and then applied to an oxygen ion implantation for MLD-SIMOX. In the first oxygen ion implantation, a wafer is heated to $400°$ C., and oxygen ions of $2.4 \times 10^{17}$ atoms/cm$^2$ are implanted at an acceleration energy of 180 keV. In the second oxygen ion implantation, the wafer is cooled to not higher than $100°$ C., and oxygen ions of $6.0 \times 10^{15}$ atoms/cm$^2$ are implanted at an acceleration energy of 170 keV. Subsequently, a high-temperature heat treatment is conducted at $1300°$ C. in a mixed gas of oxygen and argon with oxygen partial pressure of 40% to prepare an SIMOX wafer.

For comparison, a holding assembly is prepared by disposing a holding pin shown in FIG. 2 and having no canopy portion in a holder shown in FIG. 1 and then applied to an oxygen ion implantation for MLD-SIMOX in the same manner as described above.

The thickness of the SIMOX wafer obtained by the oxygen ion implantation using each of the holding assemblies is measured at 57 places by means of a spectroscopic ellipsometer to evaluate the thickness uniformity of SOI layer as a thickness range (difference between a largest value and a smallest value). The results are shown in Table 1.

TABLE 1

Figure 2A:
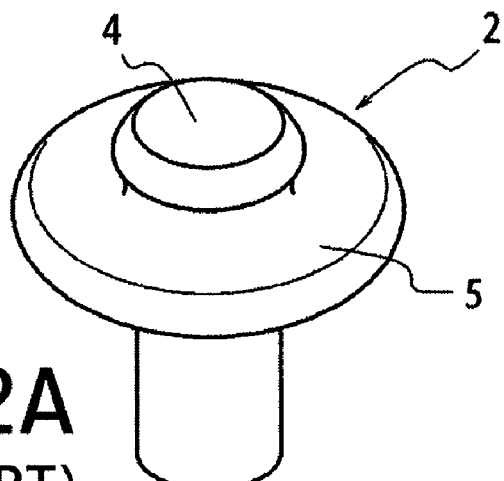
FIGS. 2A-2C are views illustrating a holding pin in a conventional wafer holding assembly.
Figure 2B:
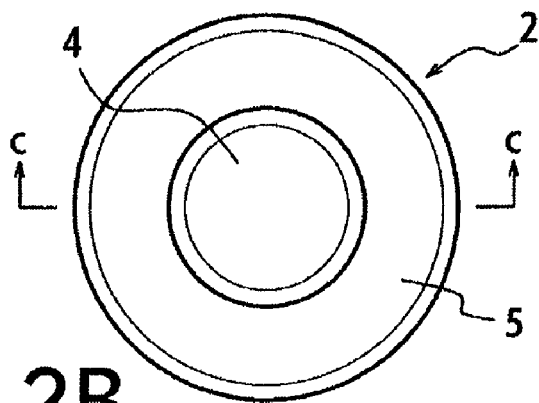
Figure 2C:
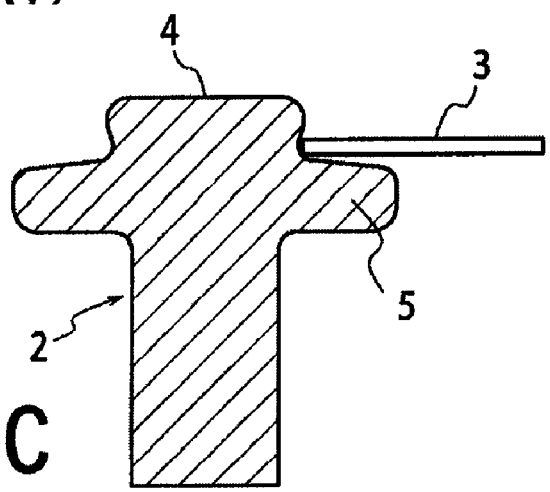

| Holding pin | | | | | | |
|---|---|---|---|---|---|---|
| Diameter of head (mm) | Diameter of flange (mm) | Canopy portion | | | Thickness range of SOI layer (nm) | Remarks |
| | | Spreading angle (°) | diameter (mm) | Corresponding figure | | |
| 6 | 15 | −60 | 15 | — | 3.0 | Invention Example |
| 6 | 15 | −40 | 15 | FIG. 4 | 2.6 | Invention Example |
| 6 | 15 | 60 | 15 | FIGS. 3A-3C | 2.4 | Invention Example |
| 6 | 15 | 90 | 15 | — | 2.4 | Invention Example |
| 6 | 15 | 180 | 15 | FIG. 5 | 2.5 | Invention Example |
| 6 | 15 | 190 | 15 | — | 2.1 | Invention Example |
| 6 | 15 | 60 | 18 | FIG. 6 | 2.2 | Invention Example |
| 6 | 15 | — | — | FIGS. 2A-2C | 3.2 | Conventional Example |

As seen from Table 1, when using the holding assembly according to the invention, the thickness of SOI in the SIMOX wafer is made uniform to reduce the temperature difference between the holding pin and the wafer.

What is claimed is:

1. A wafer holding assembly in an ion implanting apparatus having a plurality of holding pins for holding a wafer in the ion implanting apparatus, characterized in that the holding pin comprises a head contacting with an end face of the wafer to control motion of the wafer and a flange projecting from the head to place the wafer, and the head is provided with a canopy portion extending in a direction different from a side placing the wafer.

2. The wafer holding assembly in an ion implanting apparatus according to claim 1, wherein the canopy portion has a fan-like planar form.

3. The wafer holding assembly in an ion implanting apparatus according to claim 2, wherein the fan-like form of the canopy portion has a spreading angle of not less than −50°.

4. The wafer holding assembly in an ion implanting apparatus according to claim 2, wherein the spreading angle of the fan-like form of the canopy portion is not more than 180°.

5. The wafer holding assembly in an ion implanting apparatus according to claim 3, wherein the spreading angle of the fan-like form of the canopy portion is not more than 180°.

* * * * *